United States Patent [19]

Hayashi

[11] Patent Number: 4,620,157

[45] Date of Patent: Oct. 28, 1986

[54] REACTIVE POWER TO DC SIGNAL CONVERTER

[75] Inventor: Eiji Hayashi, Tokyo, Japan

[73] Assignee: Yokogawa Hokushin Electric Corporation, Tokyo, Japan

[21] Appl. No.: 741,814

[22] Filed: Jun. 6, 1985

[30] Foreign Application Priority Data

Jun. 22, 1984 [JP] Japan .................................. 59-128496

[51] Int. Cl.⁴ ............................................. G06G 7/16
[52] U.S. Cl. .................................... 328/160; 324/141; 364/571
[58] Field of Search ................. 324/141, 142; 364/483, 364/571; 328/160; 307/161, 490

[56] References Cited

U.S. PATENT DOCUMENTS 4,454,471  6/1984  Schwendtner ...................... 324/141

FOREIGN PATENT DOCUMENTS

3049     1/1982  Japan .................................. 324/141
150349   8/1984  Japan .................................. 324/141
646267   2/1979  U.S.S.R. ............................. 324/142

Primary Examiner—William H. Beha, Jr.
Attorney, Agent, or Firm—Moonray Kojima

[57] ABSTRACT

The output from a capacitor, which shifts a voltage output by $\pi/2$, and a detected frequency output, are multiplied by a pulse width modulation circuit, and a current input is switched by the multiplied output to convert a reactive power to a corresponding DC signal. The converter has improved frequency characteristics.

8 Claims, 9 Drawing Figures

REACTIVE POWER TO DC SIGNAL CONVERTER

BACKGROUND OF THE INVENTION.

1. Field of Invention

This invention relates to a converter for converting a reactive power to a corresponding DC signal.

2. Description of Prior Art

The effective power in an AC circuit is the product of a voltage and a current which is multiplied by the cosine of th phase difference between the voltage and the current. The reactive power in the AC circuit is the product of the voltage and the current which is multiplied by the sine of the phase difference. To provide a reactive power to DC signal converter using an effective power converter for measuring the reactive power in the AC circuit, a capacitor is inserted in a voltage or current path in the circuit of the effective power converter for shifting the phase of either the voltage or the current by $\pi/2$, in order to multiply the phase difference between the voltage and the current by the sine value.

Figure 2:
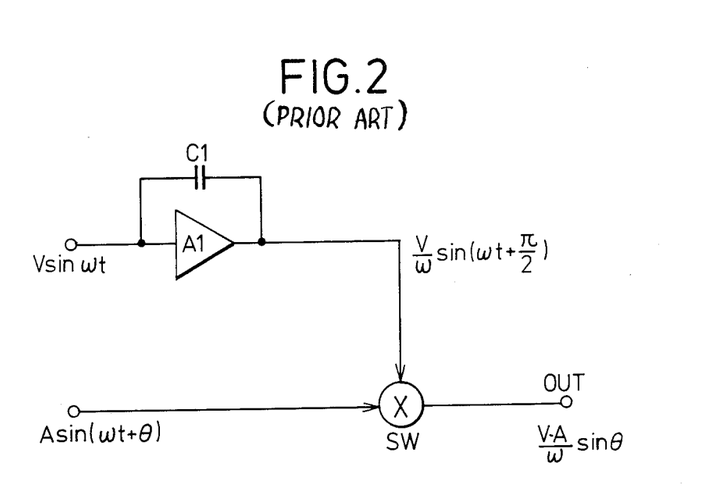
FIG. 2 a block diagram depicting a conventional converter.

One conventional example of the reactive power to DC signal converter in which the phase is shifted $\pi/2$ by the capcitor is illustrated in FIG. 2. In that FIG. 2, V sin$\omega$t is a voltage input in an AC circuit and A sin($\omega$t+$\theta$) is a current input, wherein $\omega$ is the angular frequency and $\omega$ is the phase difference between the voltage V and the current A. A capacitor C1, for shifting the phase by $\pi/2$, is connected across an operational amplifier A1 to which the voltage input Vsin$\omega$t is applied. Thus, the operational amplifier al produces at its output a voltage expressed by the following:

$$(V/\omega)\sin(\omega t + \pi/2) \quad (1)$$

wherein the input voltage V is shifted in phase by $\pi/2$. The output voltage is then applied to one input terminal of a multiplier SW. The current input Asin ($\omega$t+$\theta$) is applied directly to the other input terminal of the multiplier SW. The multiplier SW multiplies the current input A by the voltage output from the operational amplifier A1. As a result, the multiplier SW generates an output $$(V \cdot A \cdot \#) \cdot \sin \theta \quad (2)$$

Equation 2 is indicative of a reactive power in the AC circuit. A DC signal corresponding to the reactive power can be produced by smoothing out the reactive power.

The reactive power to DC signal converter shown in FIG. 2 comprises electronic components entirely and is small and highly accurate in operation. The converter is widely used as a reactive power meter in place of an ordinary wattmeter of the electrodynamometer type. In the converter shown in FIG. 2, the phase is shifted $\pi/2$ by the capacitor Cl. However, the phase shifting with the capacitor essentially varies dependent on the angular frequency ($\omega$C). Thus, the term (1/$\omega$) is present in the above equation 2, and furthermore, the converter shown in FIG. 2 is limited to a particular frquency designated by the user. This is disadvantageous in terms of cost since different converters must be tailor made to the specified frequency of the users. Accordingly, the manufacturing efficiency is correspondingly low and costs high. The situation is becoming more acute since converter users are increasingly becoming spread throughout the world where frequencies differ from place to place.

SUMMARY OF THE INVENTION.

Accordingly, an object of the invention is to overcome the aforementioned and other deficiencies and disadvantages of the prior art.

Another object is to provide a reactive power to DC signal converter which comprises electronic components and which does not require frequencies to be specified in a certain range, such as, for example, between 45 to 65 Hz.

According to the invention, there is provided a reactive power to DC signal converter comprising a capacitor for shifting the phase of either a voltage input or a current input to an AC circuit, a frequency detector circuit for producing a signal proportional to a frequency in the AC circuit, a first multiplier for multiplying the output from the capacitor by the output from the frequency detector circuit, a second multiplier for multiplying the voltage input or the current input to the AC circuit by the output from the first multiplier, and a smoothing circuit for smoothin the output from the second multiplier.

DETAILED DESCRIPTION OF PREFERRED EMBODIMENTS.

Figure 1:
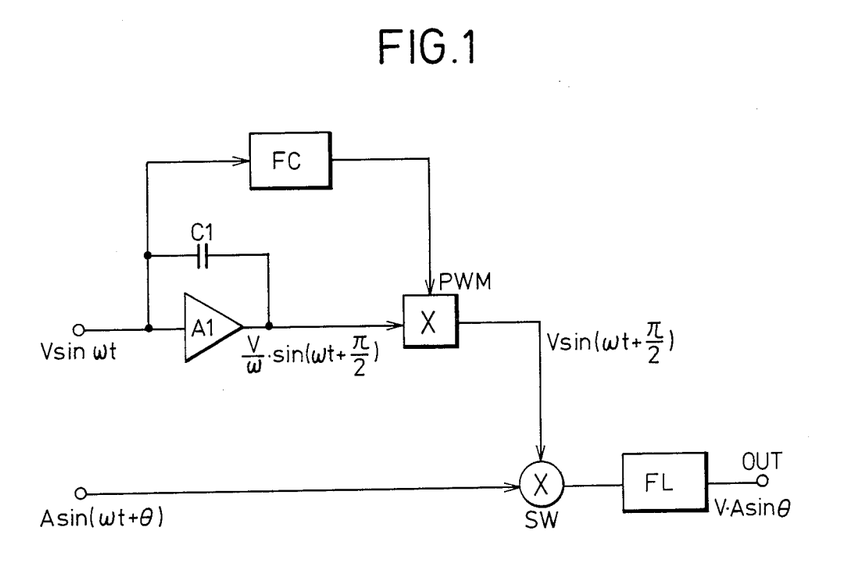
FIG. 1 a block diagram depicting the operational principles of illustrative embodiment of the invention.

In FIG. 1, designated at Vsin$\omega$t is a voltage input to an AC circuit which measures reactive power, and Asin($\omega$t+$\phi$) is a current input to the AC circuit. The converter has a capacitor C1 and an operational amplifier A1 constituting a circuit for shifting the phase by $\pi/2$. The converter also includes a multiplier circuit SW, a frequency detector circuit FC, and a multiplier circuit PWM.

The voltage input Vsin$\omega$t is shifted $\pi/2$ in phase by capacitor C1 into the voltage expressed by equation 1. The shifted voltage is applied to one input terminal of multiplier circuit PWM. Frequency detector circuit FC serves to detect angular frequency $\omega$ in the AC circuit. The signal indicative of the angular frequency $\omega$ is applied to the other input terminal of multiplier circuit PWM. Multiplier circuit PWM multiplies the inputs and generates at an output terminal voltage expressed by the following equation:

$$\omega(V/\omega)\sin(\omega t + \pi/2) = V\sin(\omega t + \pi/2) \quad (3)$$

This voltage is multiplied in multiplier Sw by current input A sin (ωt+φ). Multiplier Sw generates an output of $$V \cdot A \sin \phi \quad (4)$$

Equation 4 represents the reactive power in the AC circuit. Advantageously, equation 4 does not contain any term which is dependent on the frequency. Thus, the circuit shown in FIG. 1 can convert reactive power to a corresponding DC signal independent of the frequency. According to the invention, therefore, there is provided a reactive power to DC signal converter which is, advantageously, small in size, can be fabricated, for example, as an integrated circuit, and is highly accurate in operation, and in which no frequency need be specified. Although in FIG. 1, the voltage input is shown to be shifted π/2 in phase, the current input may instead be shifted in phase.

Figure 3:
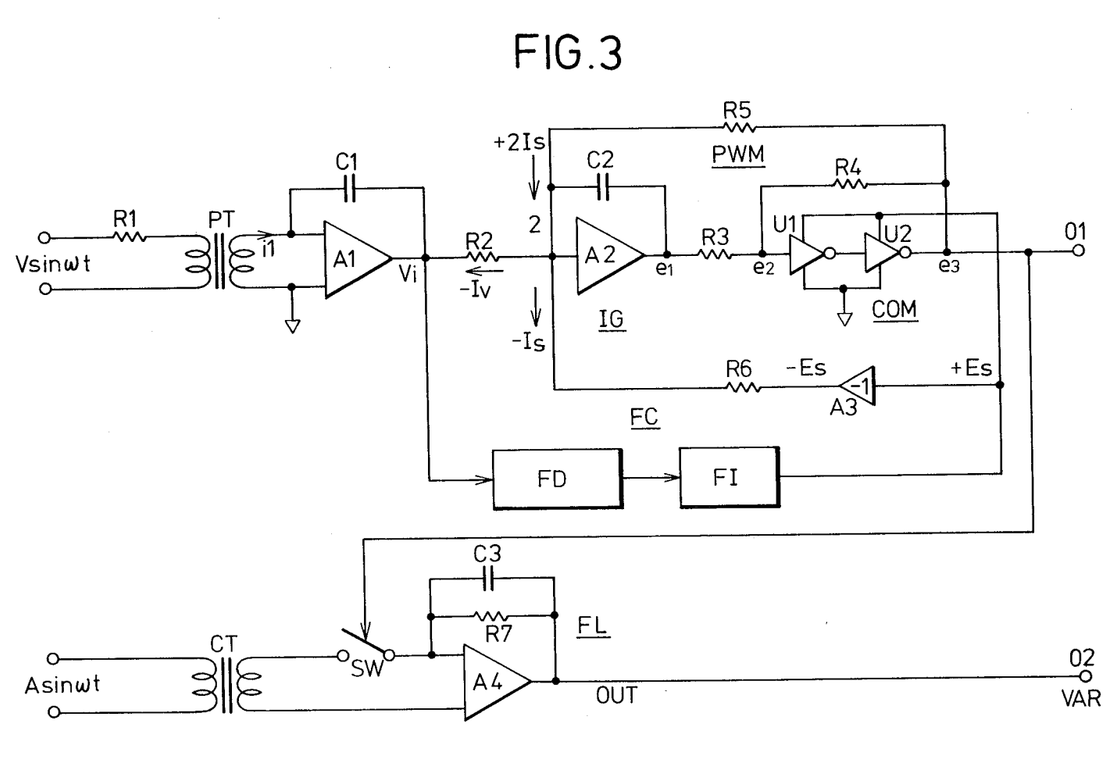
FIG. 3 a circuit diagram, partly in block form, depicting an illustrative of the invention.

FIG. 3 illustrates a circuit arrangement of the invention comprising an isolating transformer PT, a current transformer CT, and a multiplying resistor R1. The voltage Vsinωt in the AC circuit is applied via resistor R1 to transformer PT, and current A sin (ωt+φ) is applied to current transformer CT. Provided is an operational amplifier A1 and a capacitor C1 for shifting the phase by π/2. Transformer PT has a secondary winding connected to the input terminal of operational amplifier A1, and phase shifting capacitor C1 is connected across the operational amplifier A1. The voltage input V sinωt supplied through transformer PT is shifted π/2 in phase by capacitor C1. Circuit PWM which is described in FIG. 1 and is a multiplier. Multiplier PWM comprises a pulse width modulation circuit for modulating voltage input V which has been shifted π/2 in phase into a pulse width signal dependent on the amplitude of the voltage.

Multiplier PWM comprises an input resistor R2, an operational amplifier A2, and an integrating capacitor C2, which jointly constitutes an integrator IG. A comparator COM comprises resistors R3, R4 and inverters U1, U2. Inverters U1,U2 may be logic devices of a high input impedance, such as NAND gates comprising C-MOS, for example. Although two inverters are used for polarity matching, only one such inverter need be used. Integrator IG has an output terminal connected via resistor R3 to series connected circuit of inverters U1,U2. Inverter U2 has an output terminal connected to an output terminal 01 for generating a pulse width modulation signal, to the input terminal of inverter U1 through a resistor R4, and also to the input terminal of integrator IG through a resistor R5. With the output from inverter U2 being fed back to the input terminal of inverter U1 via resistor R4, comparator COM having a hysteresis is constructed of resistors R3,R4 and inverters U1, U2.

If a circuit having no hysteresis were used as comparator COM, then a reference power supply ±Es (such as disclosed,for example, in Japan Pat. No. 44-14662) would be additionally used.

With the output from inverter U2 being fed back to the input terminal of integrator IG via resistor R5, multiplier PWM of the free running pulse width modulation type is constructed of resistors R3,R4 and inverters U1,U2. If the output from comparator COM were not fed back to integrator IG, then an oscillator for generating clock pulses which determines the periodic cycle of the system would be required, such as disclosed, for example, in the above mentioned Japan Pat. No. 44-14662.

A frequency detector circuit FC for producing a signal representative of frequency F of the AC circuit comprises a frequency detector FD, for detecting the frequency F, and a reciprocal generating circuit FI, for producing an analog voltage indicating the reciprocal 1/F of the output signal from the frequency detector FD. The output voltage from reciprocal generating circuit FI is inverted in polarity by a polarity inverter circuit A3. The output terminal of operational amplifier A1 is connected through the frequency detector FD to reciprocal generating circuit FI. The output terminal of reciprocal generating circuit FI is joined to the power supply terminals of inverters U1,U2 of comparator COM, and also to the input terminal of integrator IG, through polarity inverter circuit A3 and a resistor R6. Resistor R6 has a resistance which is twice that of resistor R5.

An output circuit OUT, for extracting a DC signal corresponding to the reactive power, comprises a switch element SW, which is described as a multiplier in FIG. 1, a smoothing circuit FL, and an output terminal 02. Switch SW is connected to the output terminal 01 of multiplier circuit PWM. Smoothing circuit FL comprises an operational amplifier A4, and a smoothing capacitor C3 and a resistor R7 connected across operational amplifier A4 for smoothing current A controlled by switch SW to flow intermittently. The output from smoothing circuit F1 is generated at output terminal 02 as a DC signal corresponding to the reactive power VAR.

The operation of the converter of FIG. 3 is as follows. The voltage V and the current A in the AC circuit are applied respectively to transformers PT and CT. A voltage drop Vi across capacitor C1, which is detected from the output of operational amplifier A1, is inversely proportional to the angular velocity ω (i.e. the frequency F in the AC circuit being measured) as indicated by the following:

$$Vi = -J \times i1 \times 1/\omega C1 \quad (5)$$

wherein i1 is a current generated in the secondary winding of transformer PT. Voltage Vi is shifted π/2 in phase with respect to the input AC voltage V. Voltage Vi, which is inversely proportional to frequency F and is shifted π/2 in phase, is applied through resistor R2 to multiplier PWM.

It is assumed in the following description that a current flowing through resistor R2 under voltage Vi is expressed by −Iv. Voltage Vi is also impressed on frequency detector FD of frequency detector circuit FC which detects frequency F in the measured AC circuit. The detected frequency signal is applied to reciprocal generating circuit FI and converted thereby to an analog voltage corresponding to 1/F.

Assuming that the converted analog voltage is expressed by Es, a voltage +Es is applied to the power supply terminals of inverters U1,U2 of comparator COM and also to polarity inverter circuit A3 which applies an inverted voltage −Es to the input terminal of integrator IG through resistor R6.

It is assumed in the following description that a current flowing through resistor R6 under voltage −Es expressed by −Is.

The output terminal of integrator IG of multiplier PWM, the output terminal of inverter U1 of comparator COM, and the output terminal of inverter U2 are assumed to have potentials e1,e2,e3, respectively. The potentials e1,e2,e3 have waveforms as indicated by lines (1),(2),(3), respectively, in FIG. 4. The potential e3 is a voltage indicated by +Es at line (3) in FIG. 4, and fed back to the input terminal of integrator IG through resistor R5.

Figure 4:
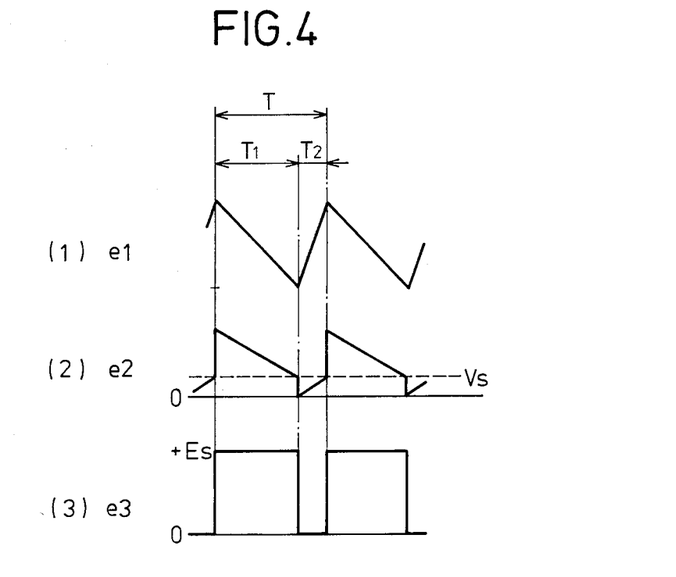
FIG. 4 a diagram explanatory of the operation of the embodiment of FIG. 3.

It is assumed in the following description that a current flowing through resistor R5 under voltage +Es is expressed by +2Is (R6=2R5). Thus, integrator IG adds and integrates a current −Iv produced by input voltage Vi, a current +2Is produced by voltage +Es, and a current −Is produced by voltage −Es. Since the parameters are selected so that |Iv|α|Is| to avoid excessive modulation under normal operating condiions, integrator IG adds and integrates (−Iv) and (+Is) while comparator COM issues voltage +Es, and the integrated output e1 is progressively reduced at a constant gradient as indicated by T1 in FIG. 4, line (1). During period T1, voltage e2 is progressively lowered at a gradient determined by resistors R3,R4 as shown in FIG. 4, line (2). When voltage e2 reaches a threshold voltage Vs of inverter U1, voltage e1 and output voltage e2 of inverter U2 falls to "0" level. When output e2 of inverter U2, i.e the voltage +Ex falls to 0 v, integrator IG integrates −(Iv +Ix).

As a result, output e1 of integrator IG is increased more sharply in a period T2 than in the period T1, as shown in FIG. 4, line (1). As output voltage e1 of integrator IG starts to rise, voltage e2 is also increased and then sharply increased when it reaches Vs. Since voltage e2 of the waveform shown in FIG. 4, line (2) is applied to inverter U1, voltage e3 at the output terminal of inverter U2 becomes voltage +Es shown in FIG. 4, line (3). Integrator IG is supplied with the sum of currents corresponding to voltage Vi, the voltage +Ex, and the voltage −Ex, during period T1, and is supplied with the sum of currents corresponding to voltage Vi and voltage −Es during period T2. That is, integrator IG is driven so that the sum of the voltages applied thereto will be zeroed. Thus, the following equation 6 is effective about the system of equilibrium condition in the multiplier circuit PWM in the pulse width modulation circuit.

$$\{(Vi+Es)\cdot T1/(T1+T2)\}+\{(Vi-Es)\cdot(T2/(T1+T2)\}=0 \quad (6)$$

wherein $(T1+T2)=T$ ... constant.

Equation 6 is solved for Vi as follows $$Vi=Es(T1-T2)/(T1+T2) \quad (7)$$

Voltage Vi which is suppled through phase shifting capacitor C1 is in inverse proportion to the angular frequency ω as indicated by equation 4. The voltage Es which is applied via reciprocal generating circuit FI corresponds to /ω. Thus, equation 7 becomes $$Vi/\omega=(Es/\omega)(T1-T2)/(T1+T2) \quad (8)$$

Equation 8 corresponds to equation 3 for the circuit of FIG. 1 and has no frequency dependent term since the terms containing ω is eliminated.

As described above, the voltage drop across capacitor C1 is inversely proportional to the frequency in the AC circuit being measured. The inversely proportional voltage is applied to multiplier circuit PWM wherein it is multiplied by output voltage Es/ω of reciprocal generating circuit FI, which is in inverse proportional to the frequency F. Thus, multiplier circuit PWM is not responsive to variations in the frequency F, and generates a pulse width modulation signal which is expressed by equation 8 wherein the degree of modulation varies only with the amplitude of the input voltage V and which is of the waveform shown in FIG. 4, line (3). The pulse width modulation signal is generated at terminal 01 and is applied to multiplying switch SW in output circuit OUT. Switch SW is opened and closed under control of the applied pulse width modulation signal such that switch SW is turned ON during period T1 and turned OFF during period T2.

Current A in AC circuit is converted by current transformer CT to a prescribed value which is fed to switch SW. Since switch SW is controlled by the output signal from multiplier circuit PWM, the current A passing through switch SW is turned ON and OFF intermittently, and the intermittent current is then smoothed by smoothing circuit FL.

The term (T1−T2)(T1+T2) in equation 8 is expressed by the following:

$$(T1 - T2)(T1 + T2) = (T1 + T2 - 2T2)/(T1 + T2) \quad (9)$$
$$= 1 - 2T2/(T1 + T2)$$

Since switch SW is constructed for one side switching,(T1−T2)/(TI+T2) is ½ of that of equation 9, and hence is expressed by the following $$(T1 - T2)(T1 + T2) = \tfrac{1}{2}\{(1 - 2T2)/(T1 + T2)\} \quad (10)$$
$$= \tfrac{1}{2} - T2/(T1 + T2)$$

From equations 9 and 10, we get $$T2(T1+T2)=\tfrac{1}{2}-V/Es \quad (11)$$

Assuming that a current intermittently controlled by the switch SW and flowing into smoothing circuit F1 is indicated by Ai, then current Ai has its envelope proportional to input current A and can be expressed by the following equation.

$$Ai = A \cdot T1(1 + T2) \quad (12)$$
$$= A \cdot (\tfrac{1}{2} - V/Es) = A/2 - V \cdot A/Es$$

The average (DC component) of equation 12 is generated at the output terminal of smoothing circuit FL.

Since the first term on the right side of equation 12 indicates an AC component only, its average is zero. Thus, output voltage Eo from smoothing circuit F1 is given by $$Eo=V\cdot A/Es \quad (13)$$

Voltage input V is shifted by π/2 in phase by capacitor C1. Thus, equation 13 becomes $$Eo=(V\cdot A/Es)\sin\phi \quad (14)$$

Eo in equation 14 is representative of the reactive power VAR in the AC circuit. As described above, a pulse width modulation signal produced by applying the output from the π/2 shifting capacitor C1 and voltage Es inversely proportional to frequency F, to multiplier circuit PWM, is not affected by the frequency, and is proportional only to the amplitude of input voltage V.

As a consequence, reactive power output VAR expressed by equation 14 is free from the influence of frequency F. Reactive power signal VAR is generated at output terminal 02 to an indicater or a digital voltmeter (not shown) for analog or digital indication.

Figure 5:
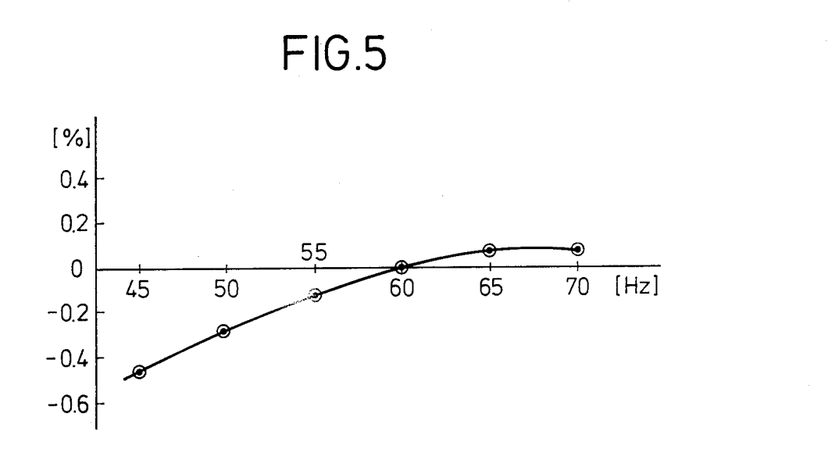
FIG. 5 a diagram depicting characteristics of the embodiment of FIG. 3.

FIG. 5 is illustrative of the results of an experiment conducted on the converter of FIG. 3. In the graph of FIG. 5, the horizontal axis represents frequencies (Hz) and the vertical axis represents errors (%). As indicated by the results, the error produced by the converter is reduced to 0.4% or less in the frequencies in the range of from 45 Hz to 65 Hz. In practical terms, this is an almost error free operation, and hence of outstanding commercial value.

Thus, in the invention, there is realized a converter for converting a reactive power to a corresponding DC signal without being substantially affected by the frequency, utilizing an effective power converter of the pulse width modulation type. As a consequence, there can be efficiently manufactured a reactive power to DC signal converter which substantially requires no frequency to be specified, and which is small in size, can be fabricated as an integrated circuit, and is highly accurate in operation.

Figure 6:
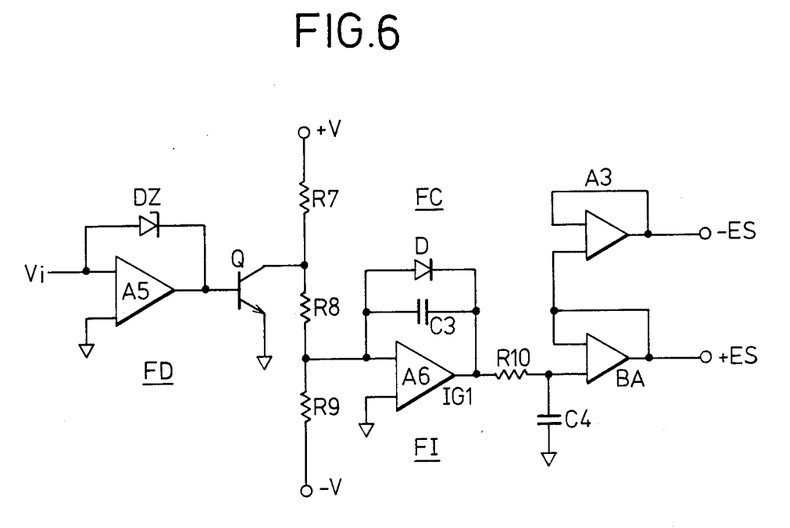
FIG. 6 a circuit diagram, partly in block form, depicting the frequency detector circuit in the embodiment of FIG. 3.

Frequency detector FD and reciprocal generating circuit FI shown in FIG. 3 may be in the form of various known circuits. One example of such circuit is shown in FIG. 6 and comprises a frequency detector circuit FD, a reciprocal generating circuit FI, a buffer amplifier BA, and a polarity inverter circuit A3. The output from buffer amplifier BA is applied to power supply terminals of inverters U1, U2 of comparator COM shown in FIG. 3. The output −Es from polarity inverter circuit A3 is applied through resistor R6 to integrator IG. The frequency detector circuit FD comprises an operational amplifier A6 and a zener diode Dz. Operational amplifier A6 generates at its output terminal a rectangular wave output commensurate wiqh frequency F in the AC circuit. Reciprocal generating circuit FI comprises a transistor Q, an operational amplifier A6, a capacitor C3, a diode D and resistors R7 through R9. Operational amplifier A6, capacitor C3, and diode D jointly constitute a unidirectional integrator IG1. Transistor Q is repeatedly turned ON and OFF in each half wave of the output from frequency detector FD. When transistor Q is turned ON, a negative voltage −V is applied to feed a current i through resistor 9 to integrator IG1. As a result, the output of integrator IG1 is increased as indicated at (1) in FIG. 7.

Figure 7:
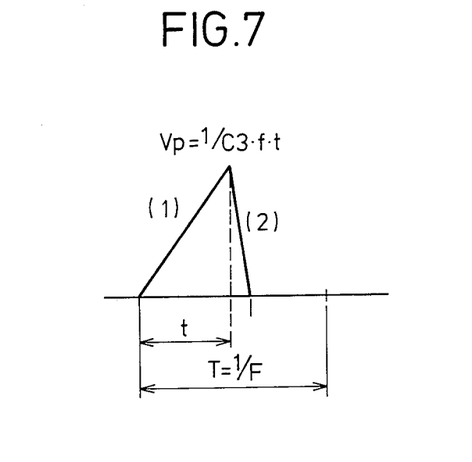
FIG. 7 diagram explanatory of the operation of the circuit of FIG. 6.

The peak value Vp of the output from the integrator IG1 is expressed by $$Vp = 1/C_3 \cdot i \cdot t = 1/C_3 \cdot i \cdot \tfrac{1}{2}F \quad (15)$$

When transistor Q is turned OFF, a voltage +V is applied through resistors R7, R8 to integrator IG1, which produces an output that sharply decreases as indicated at (2) in FIG. 7. The output of integrator IG1 as shown in FIG. 7 has an area S given by $$S = (t - Vp)/2 \quad (16)$$

Since $t \alpha 1/F$, the average S/T of area S is determined from equations 15 and 16, by the following $$S/T = k/4C_3 \cdot 1/F \cdot i \quad (17)$$

wherein T is a period and k is a constant.

Figure 8:
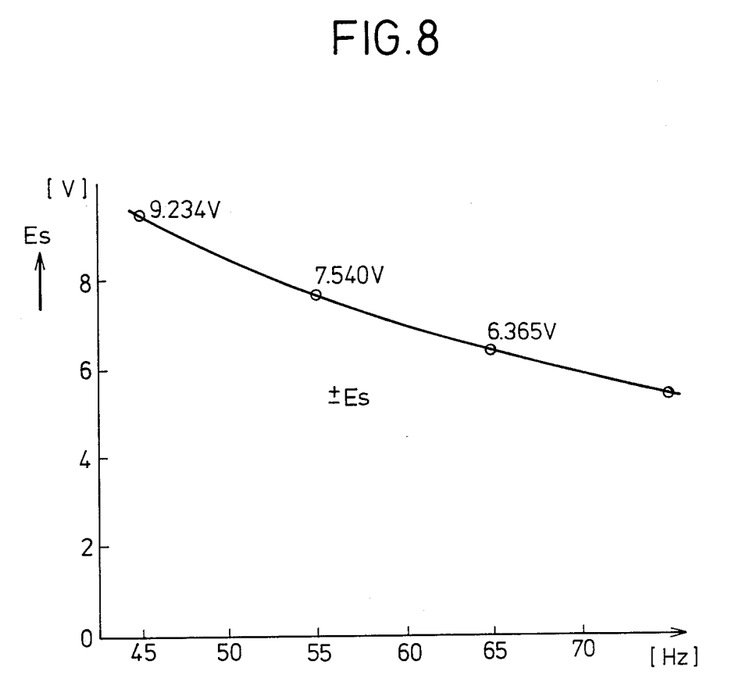
FIG. 8 a diagram depicting characteristics of the circuit of FIG. 6.

The average of the output voltage Es from operational amplifier A6 is inversely proportional to frequency F, and is picked up by a capacitor C4 and a resistor R10. The characteristics of output voltage Es from reciprocal generating circuit FI with respect to frequency F (Hz) is shown in FIG. 8.

The reactive power to DC signal converter shown in FIG. 3 is designed for use with a single phase two wire system (1Φ/2W). The circuit arrangement of FIG. 3 may be utilized to realize a reactive power to DC signal converter for use with a single phase three wire system (1Φ/3W), a three phase three wire system (3Φ/3W), or a three phase four wire system (3Φ/4W).

Figure 9:
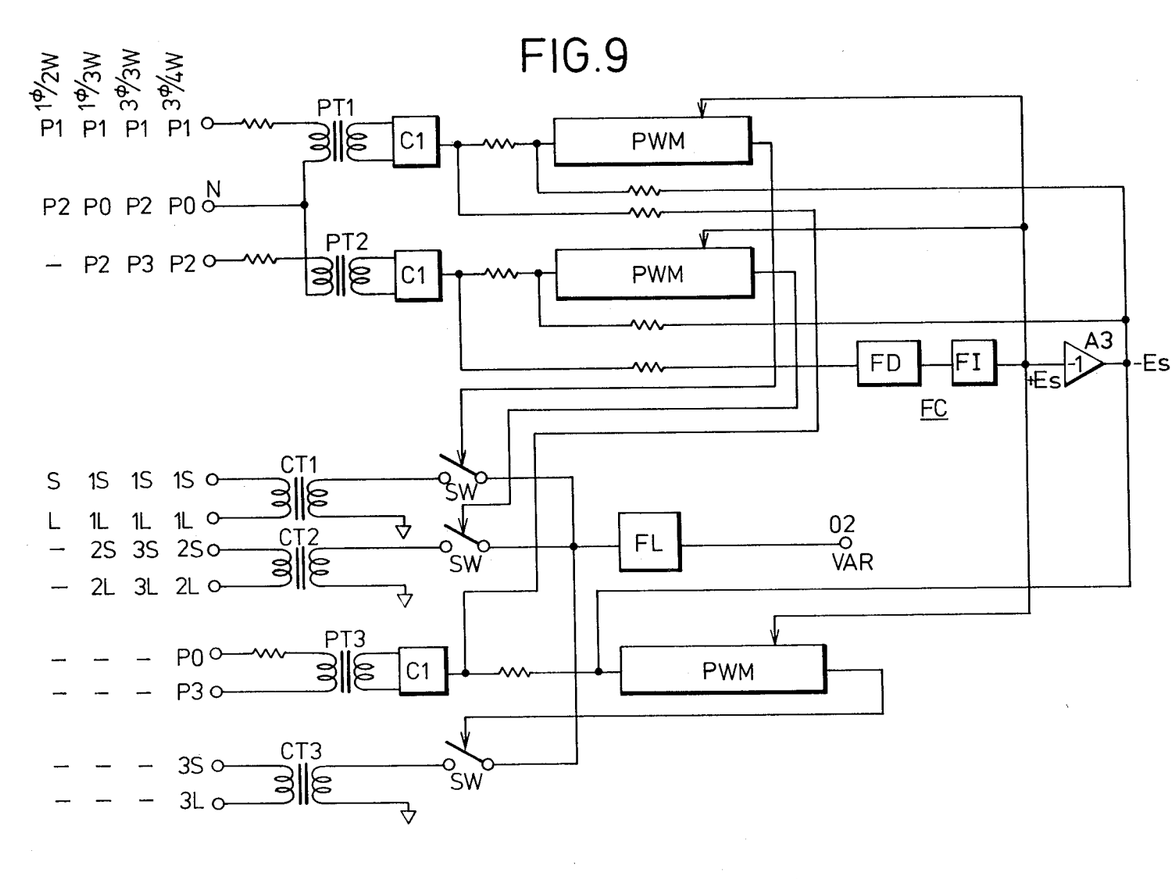
FIG. 9 is a circuit diagram, partly in block form, depicting another illustrative embodiment of the invention utilizing a plurality of phases.

FIG. 9 shows a combined circuit arrangement incorporating the circuits of FIG. 3 shown in block form. Identical parts in FIG. 9 are denoted by identical reference characters in FIG. 3. FIG. 9 shows a circuit which may be used with a single phase two wire system, (1Φ/2W), wherein a circuit comprising a transformer PT1 and a current transformer CT1, is used. For use with a single phase three wire system (1Φ/3W), a circuit comprising transformers PT1,PT2 and current transformers CT1,CT2, is used. For use with a three phase three wire system (3Φ/3W), a circuit comprising transformers PT1,PT2 and current transformers CT1,CT2 and a neutral tap N are used. For use with a three phase four wire system (3Φ/4W), a circuit comprising transformers PT1,PT2, PT3 and current transformers CT1,CT2,CT3 and the neutral tap N are used.

The the above systems, multiplier circuits PWM are used respectively for the phases, and the frequency detector circuit FC is used in common. The converter of this arrangement can produce at the output terminal 02, DC signals representative of the respective powers in the above systems (1Φ/2W), (1Φ/3W), (3Φ/3W) and (3Φ/4W), without being affected by the frequencies.

The foregoing description is illustrative of the principles of the invention. Numerous modifications and extensions thereof would be apparent to the worker skilled in the art. All such modifications and extensions are to be considered to be within the spirit and scope of the invention.

What is claimed is:

1. A reactive power to DC signal converter comprising
   a capacitor for shifting the phase of either a voltage input or a current input to an AC circuit;
   a frequency detector circuit for producing a signal proportional to a frequency in the AC circuit;
   a first multiplier circuit for multiplying the output from said capacitor by the output from said frequency detector circuit;
   a second multiplier circuit for multiplying the voltage input or the current input to the AC circuit by the output from said first multiplier circuits; and
   a smoothing circuit for smoothing the output from said second multiplier.

2. The converter of claim 1, wherein said frequency detector circuit comprises a frequency detector and a reciprocal generating circuit for generating a signal inversely proportional to the output from said frequency detector, said first multiplier circuit comprises a pulse width modulation circuit comprising an integrator and a voltage comparator having a hysteresis for comparing the output from said integrator with a voltage of a prescribed level, and means for applying the output from said voltage comparator, the output from said capacitor, and the output from said frequency detector circuit to said integrator for producing a pulse width modulation signal corresponding to the amplitude of the voltage input or the current input to the AC circuit.

3. The converter of claim 2, wherein said voltage comparator comprises first and second inverters connected in series to an input resistor, and a resistor for feeding the output from said second inverter therethrough back to said first inverter.

4. The converter of claim 2, wherein said voltage comparator comprises first and second NAND gates connected in series to an input resistor, and a resistor for feeding the output from said second NAND gate therethrough back to said first NAND gate.

5. The converter of claim 2, wherein said frequency detector circuit comprises an operational amplifier and a zener diode connected across said operational amplifier.

6. The converter of claim 2, wherein said reciprocal generating circuit comprises a transistor driven by the output from said frequency detector and a unidirectional integrator connected to an output terminal of said transistor.

7. The converter of claim 1, wherein said first and second multiplier circuits are provided for each of a plurality of phases and wherein said frequency detector circuit and said smoothing circuit are shared in common by said plurality of phases.

8. The converter of claim 7, wherein each of said first multiplier circuits comprises a pulse width modulation circuit, and each of said second multiplier circuits comprises a switch element.

* * * * *